United States Patent [19]
Wood et al.

[11] Patent Number: 6,036,872
[45] Date of Patent: Mar. 14, 2000

[54] METHOD FOR MAKING A WAFER-PAIR HAVING SEALED CHAMBERS

[75] Inventors: R. Andrew Wood, Bloomington; Jeffrey A. Ridley, Burnsville; Robert E. Higashi, Shorewood, all of Minn.

[73] Assignee: Honeywell Inc., Minneapolis, Minn.

[21] Appl. No.: 09/052,645

[22] Filed: Mar. 31, 1998

[51] Int. Cl.[7] .................................................. C23F 1/00
[52] U.S. Cl. ............................ 216/2; 216/2; 216/24; 216/33; 216/39; 216/56; 438/54; 438/456; 438/700; 438/703
[58] Field of Search .................................. 216/2, 24, 33, 216/39, 56; 438/54, 456, 700, 703

[56] References Cited

U.S. PATENT DOCUMENTS

| | | | |
|---|---|---|---|
| 4,701,424 | 10/1987 | Mikkor | 438/455 |
| 5,366,587 | 11/1994 | Ueda et al. | 216/101 |
| 5,528,452 | 6/1996 | Ko | 361/283.4 |
| 5,585,311 | 12/1996 | Ko | 438/53 |
| 5,851,631 | 12/1998 | Borden et al. | 428/156 |

*Primary Examiner*—Nam Nguyen
*Assistant Examiner*—Julian A. Mercado
*Attorney, Agent, or Firm*—John G. Shudy, Jr.

[57] ABSTRACT

A method for fabricating a wafer-pair having at least one recess in one wafer and the recess formed into a chamber with the attaching of the other wafer which has a port plugged with a deposited layer on its external surface. The deposition of the layer may be performed in a very low pressure environment, thus assuring the same kind of environment in the sealed chamber. The chamber may enclose at least one device such as a thermoelectric sensor, bolometer, emitter or other kind of device. The wafer-pair typically will have numerous chambers, with devices, respectively, and may be divided into a multiplicity of chips.

24 Claims, 4 Drawing Sheets

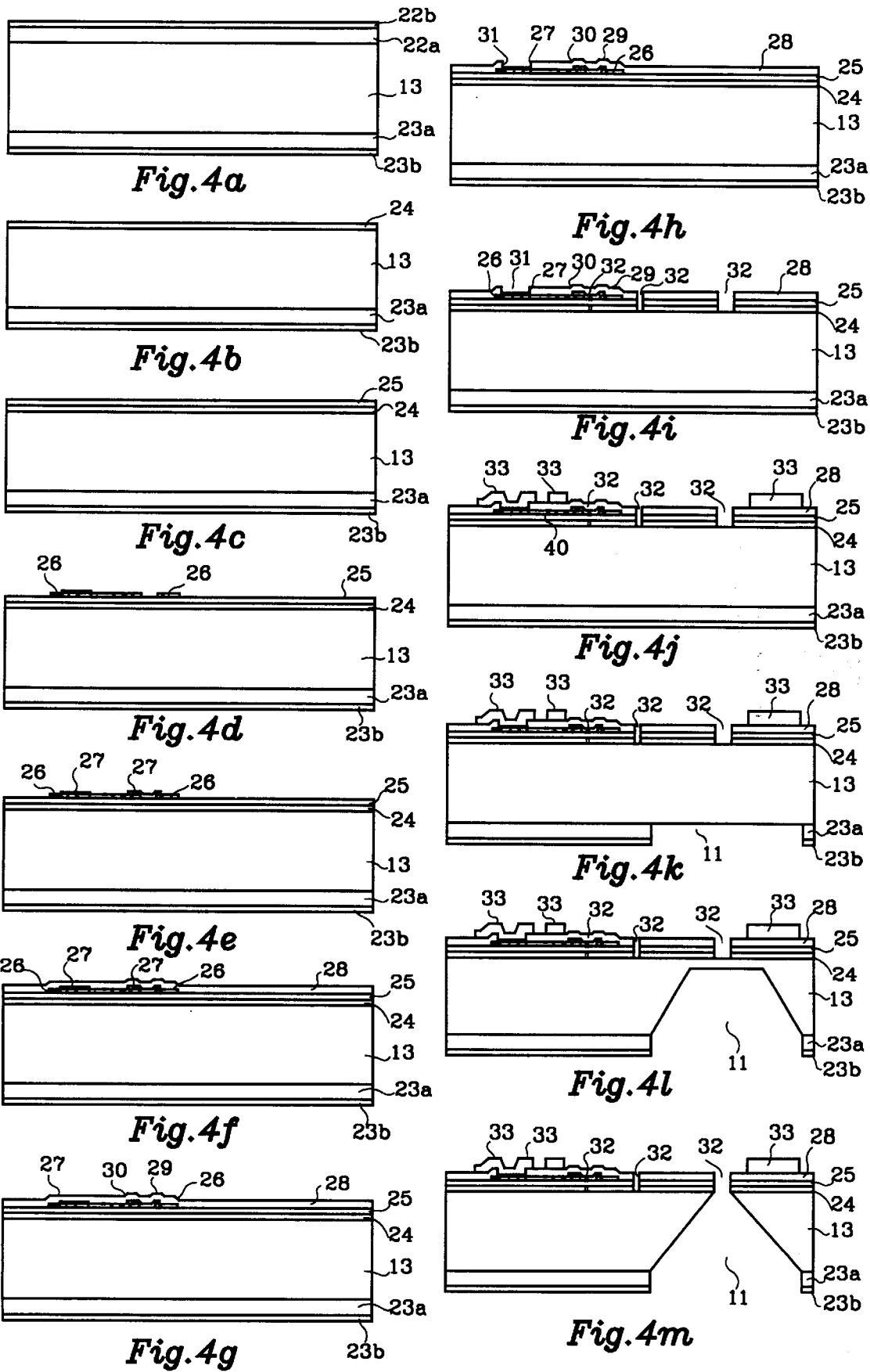

1

METHOD FOR MAKING A WAFER-PAIR HAVING SEALED CHAMBERS

The Government may have rights in this invention pursuant to Contract No. MDA972-95-3-002 awarded by the DARPA.

BACKGROUND

The present invention pertains to vacuum encapsulated microstructure devices. It particularly pertains to the vacuum seal of a cavity between two wafers, and more particularly to the fabrication of such two wafers having a plugable hole for evacuation of gases from the cavity.

Various devices, such as microstructure infrared (IR) devices, require vacuum encapsulation for optimal performance. Conventional vacuum packaging is complex and costly. Known prior art approaches to wafer level vacuum sealing cannot yield adequately low pressures, the best in the range of 0.5 torr. Such pressures resulted in 50 percent signal losses for thermoelectric (TE) devices as an example.

SUMMARY OF THE INVENTION

The present invention involves the sealing of two wafers together resulting in a cavity between the wafers with a plugable hole for the evacuating of gases from the cavity. The hole, after evacuation of gases from the cavity, is plugged with deposited metal. The result is an integral vacuum package (IVP). This approach permits the sealing of the two wafers together without having to create the vacuum seal at the same time. The final vacuum seal can be done in a high vacuum by either evaporation or the sputtering of a thick layer of metal to plug the small pump-out port. This approach allows a thorough baking out of the wafer to wafer seals and interior surfaces prior to a final vacuum seal. It separates the two functions and does not limit the bake-out to the solder processing steps. There is independent control over sealing and bake-out to maximize bond yield and minimize residual pressure. This approach also permits clear access of each vacuum cavity directly, thereby avoiding the need to pump from the periphery of the wafer inwards. The procedure here has been implemented and resulted in vacuum levels below 10 millitorr of residual pressure as measured by pressure sensors within the cavity. The seals cover significant substrate topography. Seals over topography of 0.25 microns have been demonstrated. The required processing temperatures are below 300 degrees Centigrade (C.). These chips can be handled with conventional chip handling equipment. Yields for this process exceed 90 percent. Costs of the present vacuum-sealed chips are 80 to 90 percent less than that of conventionally vacuum-sealed chips. The present approach results in sealed devices that have high temperature longevity for pressures below 100 millitorr; ten years is indicated by test data for ambient temperatures up to 150 degrees C. Each cavity may have a gas instead of a vacuum. Each cavity, chamber or volume may contain detectors such as thermoelectric detectors, devices, bolometers, or may contain emitters.

BRIEF DESCRIPTION OF THE DRAWING

FIGS. 4a, 4b, 4c, 4d, 4e, 4f, 4g, 4h, 4i, 4j, 4k, 4l and 4m illustrate the fabrication process for a detector wafer.

DESCRIPTION OF THE EMBODIMENT

Figure 1A:
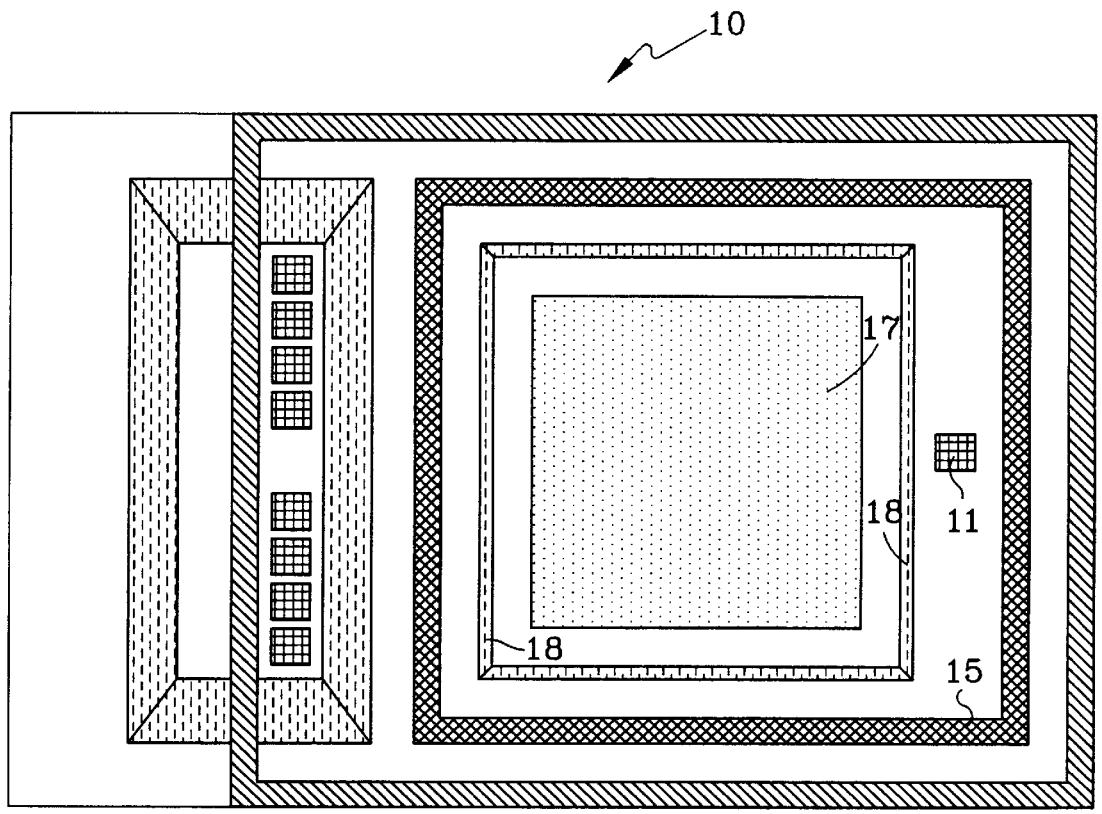
FIGS. 1a and 1b show plan and cutaway side views of a detector chip having a chamber with a deposited plug vacuum seal.
Figure 1B:
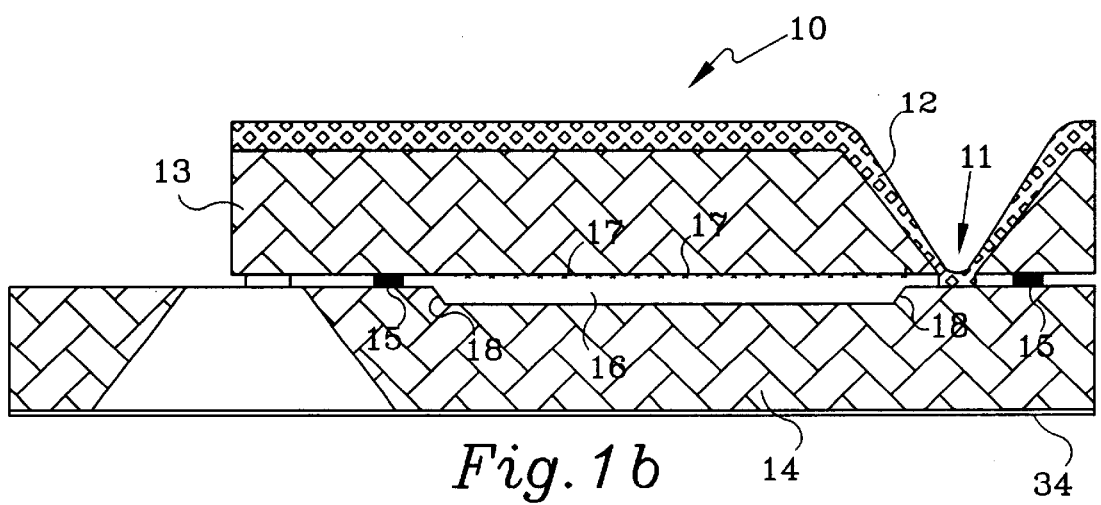
Figure 2:
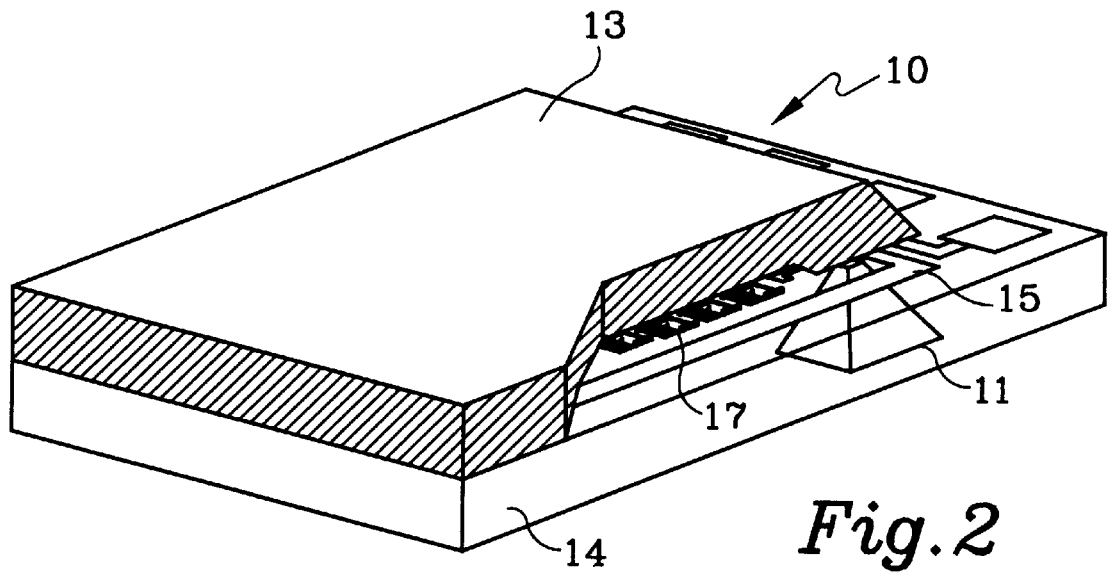
FIG. 2 shows a perspective view of the device chip having the deposited plug vacuum seal.

FIGS. 1a, 1b and 2 show an illustration of a device 10 having a vacuum pump-out port 11 and a deposited plug final vacuum seal 12. The deposited layer 12 seals port 11 to hermetically seal chamber 16. Wafers 13 and 14 are of the same material, such as silicon, thereby having the same coefficients of thermal expansion. Wafers 13 and 14 are adhered together at a solder seal ring 15. Wafer 13 is the detector chip and wafer 14 is the top cap. Cavity 16 is the chamber that contains an array 17 of detectors on the surface of wafer 13 and detects radiation which may come through an anti-reflective coated silicon window of top cap 14.

Cavity 16 is effected by a recess of about 125 microns into wafer 14 having a border 18. It is this cavity that is outgassed to result in a cavity vacuum. Top cap 14 is about 430 microns thick and chip 13 is about 500 microns thick. Seal ring 15 is a composition of 90 percent lead and 10 percent indium. Plug 12 is about 20 microns thick and is a composition of 50 percent lead and 50 percent indium.

Figure 3:
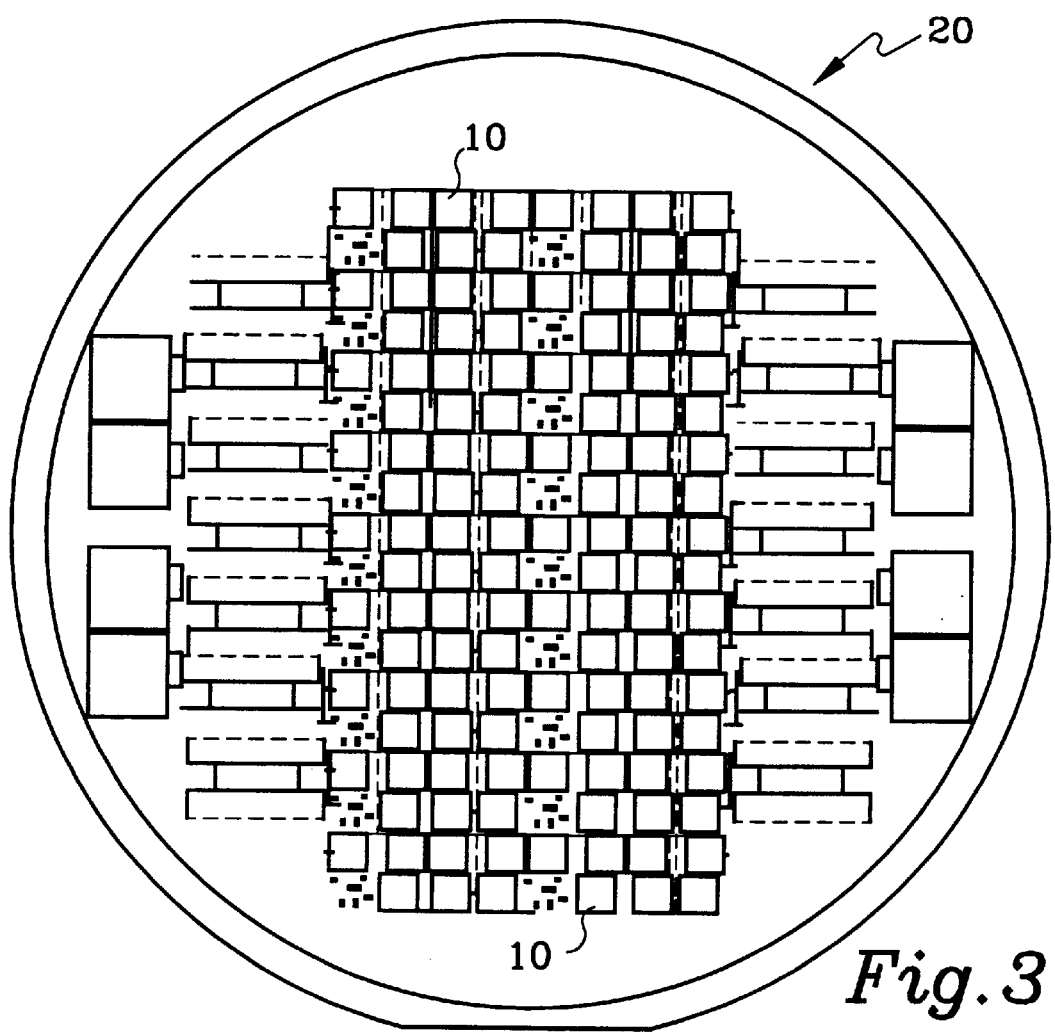
FIG. 3 reveals a wafer having a plurality of detectors with a deposited vacuum seal on a plurality of plugs.

FIG. 3 shows a wafer 20 having multiple chips 10 having a wafer-to-wafer sealing of the same material for multiple cavities. Cavities 16 can be baked out and outgassed since each chamber 16 has an open port 11. Then in an environment of a vacuum, a deposition of metal 12 is applied to the wafer 13 surface having ports 11 and thereby close ports 11 and seal chambers 16 closed with a vacuum in the chambers. Solder balls for sealing of the ports closed has been tried with little success of maintaining a vacuum or low pressure in the cavities. The present wafers 13 and 14, after bonding and sealing, may be sawed into individual chips without breakage since the sealed top cap protects the fragile microstructure devices 17. Further, the plug will not be disturbed since it is a deposited layer 12 rather than some dislodgable solder ball or plug.

A process for developing chip 10 is shown in FIGS. 4a through 4m. The process for detector wafer 13 starts out with a double polished silicon wafer 13. In FIG. 4a, one micron layers 22a and 23a of thermal $SiO_2$ are grown on wafer 13, and 0.3 micron layers 22b and 23b of low pressure chemical vapor deposited (LPCVD) $Si_3N_4$. $Si_3N_4$ layer 22b and $SiO_2$ layer 22a are removed from the "front" of wafer 13. A 1000 angstroms of a thermal $SiO_2$ layer 24 is grown on the front of wafer 13 in FIG. 4b. A layer 25 of 2000 angstroms of $Si_3N_4$ (bottom bridge nitride) is deposited on layer 24 in FIG. 4c. The first metal NiFe (60:40) of a thermocouple is deposited as a 1100 angstrom layer 26 on layer 25 and then first metal layer 26 is patterned with a first mask by ion milling resulting in the layout of FIG. 4d.

For the second metal of the thermocouple detectors, a thousand angstrom layer 27 of chromium is deposited on layers 25 and 26. Layer 27 in FIG. 4e is patterned with a second mask by ion milling and wet etching. A layer 28 consisting of 6000 angstroms of $Si_3N_4$ is deposited on metal layers 26 and 27, and layer 25, as the top bridge nitride in FIG. 4f. An absorber 29 is deposited on layer 28 of FIG. 4g and patterned with a third mask. Absorber 29 is capped with a layer 30 of $Si_3N_4$. Plasma etched vias 31 to metal layer 27 are patterned and cut with the use of a fourth mask, as shown in FIG. 4h. Plasma etched vias 32 in FIG. 4i for the final etch are patterned and cut with the use of a fifth mask. Five hundred angstroms of Cr, 2000 angstroms of Ni and 5000 angstroms of Au are deposited, patterned and lifted off for pad and solder frame metal 33 in FIG. 4j. Passivated leadouts 40 in first metal 26 or second metal 27 pass under the seal ring metal 33 in FIG. 4j. Plasma etched pump-out port vias 11 are patterned and cut on layers 23b and 23a of the back of wafer 13 in FIG. 4k. There is a KOH etch of the back side of wafer 13 through 90 percent of wafer 13 for port 11 in FIG. 4l. Port 11 is completed with an etch through via 32 to the front of wafer 13 as shown in FIG. 4m.

Top cap wafer 14, like detector wafer 13, is fabricated with films compatible with 300 degree C. bakes and low outgassing. Wafer 14 acts as the window for infrared devices 17. An additional constraint is that wafer 14 is made from low oxygen silicon (i.e., float zone silicon) to minimize the $SiO_2$ absorption peak in the 8–14 micron wavelength window. Top cap wafer 14 is coated with an anti-reflection coating 34. Wafer 14 has a solder adhesion metal and solder ring 15 which matches detector wafer 13, a border 18 forming chamber 16 above detectors 17, and holes 35 through wafer 14 to access the wire bond pads on detector wafer 13.

Figure 5A:
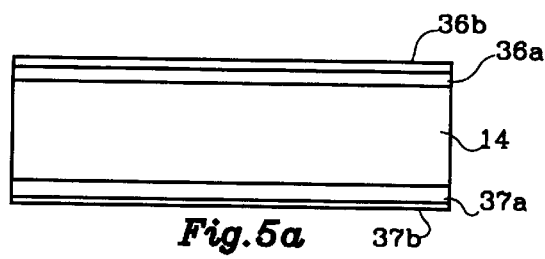
FIGS. 5a, 5b, 5c, 5d, 5e and 5f illustrate the fabrication process for a top cap wafer.
Figure 5B:
Figure 5C:
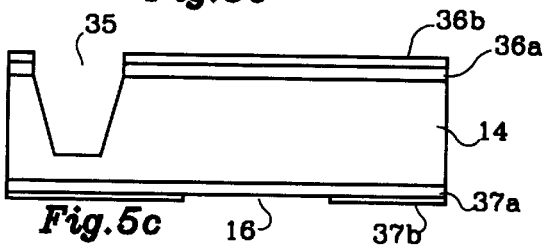
Figure 5D:
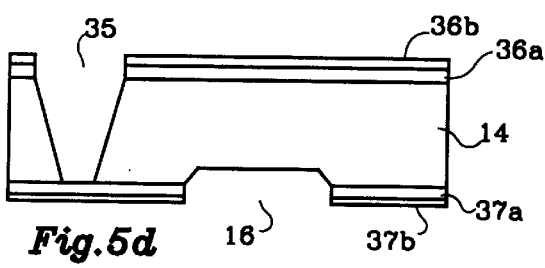
Figure 5E:
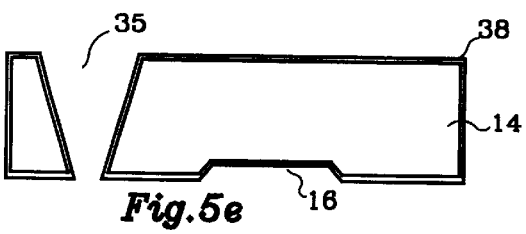
Figure 5F:
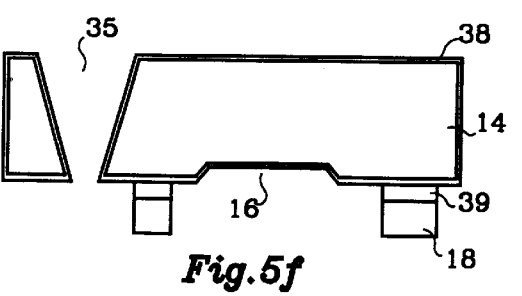

FIGS. 5a through 5f illustrate steps of fabrication for top cap 14. The starting material is a double polished silicon wafer 14 grown by float zone for minimum oxygen content. 1.8 micron layers of thermally grown $SiO_2$ 36a and 37a in FIG. 5a are covered by 0.3 microns of LPCVD $Si_3N_4$ layers 36b and 37b to mask the KOH etching. Pattern and cut via 35 by plasma etching on outside layers 36a and 36b and recess 16 on inside layer 37b of $Si_3N_4$ in FIG. 5b. The wafer 14 is then put in a fixture to allow etching of the outside surface 35 and 36b while protecting the inside 16 and 37b to KOH etch wafer 14 through hole 35 to 90 percent of the way through top cap wafer 14, as shown in FIG. 5c. Wafer 14 is removed from the etching fixture and hole 16 is cleared of remaining SiO2 layer 37a in FIG. 5d by buffered oxide etch. Hole 35 is further etched through wafer 14 to layer 37a to complete bond pad hole 35. Also, FIG. 5d shows the etching that creates recess 16 on the inside of wafer 14. Nitride and oxide mask layers 36a, 36b, 37a and 37b are stripped from wafer 14. Antireflective coating 38 is applied to wafer 14. A solder ring pattern is applied to the inside surface encircling recess 16, by using a laminated Riston process for lift-off. Five hundred angstroms of Ti, 2000 angstroms of Ni and 500 angstroms of Au of adhesion metals 39 are deposited in an E-beam evaporator. A five micron layer 40 of InPb (10:90) solder is deposited onto adhesion metals 39 in the thermal evaporator. The Riston mask is lifted off and the field $SiO_2$ in BOE etched off resulting in solder ring 18 in FIG. 5f.

Figure 6A:
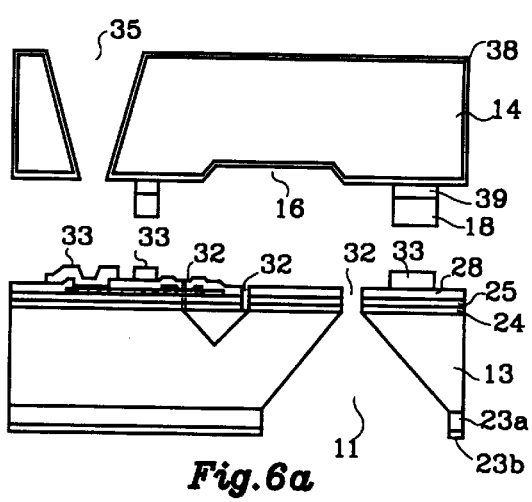
FIGS. 6a, 6b and 6c illustrate the steps of aligning, bonding and sealing the detector and top cap wafers.
Figure 6B:
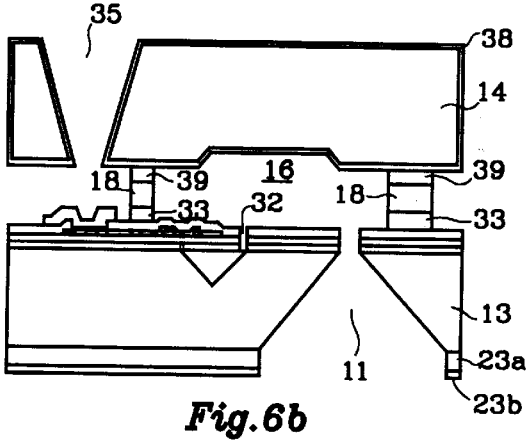
Figure 6C:
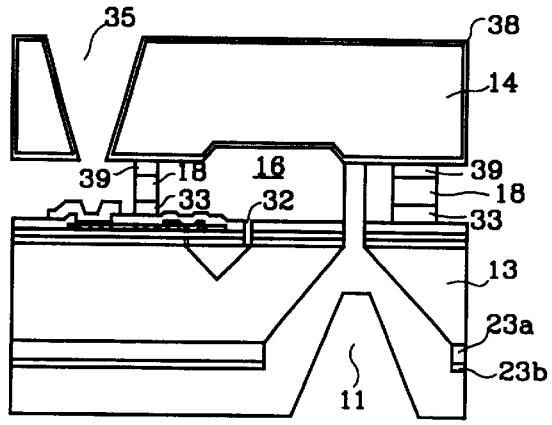

Bonding and sealing detector wafer 13 and top cap wafer 14 are done with clean surfaces. Bonding surfaces of wafers 13 and 14 are sputter cleaned just prior to doing the wafer bond. The following sequence of events indicate how to align, bond and seal the wafer pair 13 and 14 of FIGS. 6a, 6b and 6c. To begin, the Au solder ring surface 33 of detector wafer 13 is sputter cleaned. The InPb surface of ring 18 of top cap wafer 14 is oxygen plasma cleaned. Wafers 13 and 14 of FIG. 6a are aligned in a bonding cassette using 0.002 inch spacers between the wafers. The aligned wafer pair is put in a vacuum press which is pumped to a good vacuum with a turbo pump. Wafers 13 and 14 are pressed together in FIG. 6b, with about 400 pounds of pressure. The temperature of the wafers is ramped up to 300 degrees C., which takes about one hour. Then wafers 13 and 14 are held at this achieved temperature and pressure for five minutes. Then wafers 13 and 14 are cooled down to room temperature, and the vacuum chamber is vented.

Bonded wafer pair 13 and 14 is put into an E-beam evaporation system for sputter cleaning of the pump-out port 11 surfaces, followed by adhesion layers of 500 angstroms of Ti, 1000 angstroms of Ni and 500 angstroms of Au. Wafer pair 13 and 14 is put into a thermal evaporator system; and a bake out of the wafer pair at 250 degrees C. is preferred for four hours under a vacuum. The wafer pair 13 and 14 is cooled down but the environment about the wafer pair is kept at the desired vacuum. Twenty microns of InPb (50:50) 12 is deposited onto the backside of detector wafer 13 to plug port 11 in FIG. 6c, to seal vacuum chamber 16 of wafer pair 13 and 14. On the wafer 20 scale, a plurality of ports 11 in a plurality of chips are plugged. Then wafers 13 and 14, combined as wafer 20, may be removed from the vacuum environment. Wafer 20 may be cut into individual chips 10, each having its own sealed chamber 16 enclosing detectors 17.

Further variations on this theme include top cap wafer 14 composed of Germanium for better IR transmission or ZnSe for broadband transmission (i.e., visible and IR)or other optical window materials for application specific optical bandpass behavior. Top cap wafer 14 may have integrated components built in or on the surface in addition to those on the detector wafer 13. Detector wafer 13 having a diaphragm pressure sensor integrated into it, the sealed chamber then forms a vacuum pressure reference. Detector wafer 13 may have infrared bolometer arrays with readout electronics integrated into the wafer. Detector wafer 13 may have moving parts to be sealed in a chamber for other functional purposes. The bonded wafer pair 13 and 14 in FIG. 6c may be hermetically sealed with a controlled residual pressure of a specific gas type for optimal thermal, mechanical or other properties rather than simply evacuated for the devices within the chamber.

We claim:

1. A method for making a wafer-pair having deposited layer plugged sealed chambers, comprising:

growing a thermal layer on a first side of a first silicon wafer;

depositing a nitride layer on the thermal layer;

depositing, patterning and removing portions of first metal layer on the nitride layer for a plurality of devices;

depositing, patterning and removing portions of a second metal layer on the nitride and first metal layers for the plurality of devices;

patterning and removing material from the first silicon wafer and layers on the first side of the first silicon wafer and from a second side of the first silicon wafer to make a plurality of pump-out ports through the first silicon wafer and layers on the first silicon wafer;

masking and removing material from a first side of a second silicon wafer to form a plurality of recesses in the first side of the second silicon wafer;

forming a sealing ring on the first side of the second silicon wafer around each of the plurality of recesses; and positioning the first side of the first silicon wafer next to the first side of the second silicon wafer; and wherein:

each sealing ring is in contact with at least one of the layers on the first side of the first silicon wafer;

each recess of the plurality of recesses results in a chamber containing at least one device of the plurality of devices;

each sealing ring encloses at least one pump-out port of the plurality of pump-out ports; and the first and second silicon wafers are effectively a bonded together set of wafers.

2. The method of claim 1, further comprising:

placing the set of wafers in an environment of a vacuum wherein a vacuum occurs in each chamber via the at least one pump-out port; and depositing a layer of material on the second side of the first silicon wafer and the plurality of pump-out ports on the second side of the first silicon wafer, wherein each chamber is sealed from the environment.

3. The method of claim 2, further comprising baking out the set of wafers prior to depositing the layer of material on the second side of the first wafer and the plurality of pump-out ports on the second side of the first silicon wafer.

4. The method of claim 3, further comprising coating the second wafer with antireflection material.

5. The method of claim 4, wherein the second silicon wafer is made from low oxygen silicon or float zone silicon to minimize an absorption peak in an 8–14 micron wavelength region of light going through the second silicon wafer to the plurality of devices.

6. The method of claim 5, wherein the set of wafers is cut into a plurality of chips wherein each chip has one or more sealed chambers.

7. The method of claim 6, wherein the plurality of devices comprise thermoelectric detectors.

8. The method of claim 6, wherein the plurality of devices comprise bolometers.

9. A method for making a wafer-pair having at least one deposited layer plugged sealed chamber, comprising:

growing a first thermal layer on a first side of a first silicon wafer;

depositing a nitride layer on the first thermal layer;

depositing and patterning a first metal layer on the nitride layer for at least one device;

depositing and patterning a second metal layer on the nitride layer and the first metal layer for the at least one device;

patterning and removing material from the first silicon wafer and layers on the first side of the first silicon wafer and from a second side of the first silicon wafer to make a pump-out port through the first silicon wafer and the layers on the first silicon wafer;

masking and removing material from a first side of a second silicon wafer, to form a recess in the first side of the second silicon wafer;

forming a sealing ring on the first side of the second silicon wafer around the recess; and positioning the first side of the first silicon wafer next to the first side of the second silicon wafer; and wherein:

the sealing ring is in contact with at least one of the layers on the first side of the first silicon layer;

the at least one device is within the recess resulting in a chamber containing the at least one device;

the pump-out port is within the sealing ring; and the first and second silicon wafers are effectively a bonded together set of wafers.

10. The method of claim 9, further comprising:

placing the bonded together set of wafers in an environment of a vacuum wherein a vacuum occurs in the chamber via the pump-out port; and depositing a layer of material on the second side of the first silicon wafer and the pump-out port on the second side of the first silicon wafer, wherein the chamber is sealed from the environment.

11. The method of claim 10, further comprising baking out the bonded together set of wafers prior to depositing the layer of material on the second side of the first wafer and the pump-out port on the second side of the first silicon wafer.

12. The method of claim 11, wherein the at least one device is a detector.

13. The method of claim 12, further comprising coating the second silicon wafer with antireflection material.

14. The method of claim 11, wherein the second silicon wafer is made from low oxygen silicon or float zone silicon to minimize an absorption peak in an 8–14 micron wavelength region of light going through the second silicon wafer to the at least one device.

15. The method of claim 14, wherein the at least one device is a thermoelectric detector.

16. The method of claim 14, wherein the at least one device is a bolometer.

17. The method of claim 11, wherein the at least one device is an emitter.

18. A method for making a wafer-pair having at least one deposited layer plugged sealed chamber, comprising:

growing a first layer of thermal $SiO_2$ on a first side of a first silicon wafer;

depositing a first layer of $Si_3N_4$ on the first layer of thermal $SiO_2$;

growing a second layer of thermal $SiO_2$ on a second side of the first silicon wafer;

depositing a second layer of $Si_3N_4$ on the second layer of thermal $SiO_2$;

depositing a layer of a first metal on the second layer of $Si_3N_4$;

patterning the layer of the first metal;

depositing a layer of a second metal on the layer of the first metal;

patterning the layer of the second metal;

depositing a third layer of $Si_3N_4$ on the layers of the first and second metals;

etching at least one via through the third layer of $Si_3N_4$, the layers of the second and first metals, the second layer of $Si_3N_4$ and the second layer of thermal $SiO_2$;

etching a pump-out port through the first layer of $SiO_2$ and a first portion of the silicon wafer proximate to the at least one via;

etching within the at least one via through a second portion of the silicon wafer to the pump-out port;

growing a third layer of thermal $SiO_2$ on a first side of a second silicon wafer and a fourth layer of thermal $SiO_2$ on a second side of the second silicon wafer;

growing a fourth layer of $Si_3N_4$ on the third layer of thermal $SiO_2$ and a fifth layer of $Si_3N_4$ on the fourth layer of $SiO_2$;

patterning and cutting the fourth layer $Si_3N_4$ and the third layer of thermal $SiO_2$ for a bond pad area;

etching a first portion of the second silicon wafer through the fourth $Si_3N_4$ layer and third $SiO_2$ layer for the bond pad area;

patterning and cutting the fifth layer of $Si_3N_4$ and fourth layer of thermal $SiO_2$ for a recess area;

etching a second portion from the second side of the second silicon wafer to form a recess;

applying an optical coating to the second silicon wafer to substantially reduce reflections;

applying a solder ring proximate to a perimeter of the recess, on the second side of the second silicon wafer;

aligning the first silicon wafer with the second silicon wafer, having the first side of the first silicon wafer and the second side of the second silicon wafer face each other;

putting the first and second silicon wafers in a vacuum;

pressing the first and second silicon wafers together with a pressure;

ramping the temperature of the silicon wafers up to a high temperature;

increasing the pressure of the first and second silicon wafers against each other to bond the silicon wafers to each other;

baking out the first and second silicon wafers;

cooling down the first and second silicon wafers under a maintained vacuum;

depositing a layer of a metal on the second side of the second silicon wafer to plug the pump-out port to seal the recess with a vacuum; and removing the bonded first and second silicon wafers from the vacuum.

19. A method for making a wafer-pair having deposited layer plugged sealed chambers, comprising:

growing a thermal layer on a first side of a first silicon wafer;

patterning and removing material from the first silicon wafer and layers on the first side of the first silicon wafer and from a second side of the first silicon wafer to make a plurality of pump-out ports through the first silicon wafer and layers on the first silicon wafer;

masking and removing material from a first side of a second silicon wafer to form a plurality of recesses in the first side of the second silicon wafer;

forming a sealing ring on the first side of the second silicon wafer around each of the plurality of recesses; and positioning the first side of the first silicon wafer next to the first side of the second silicon wafer; and wherein:

each sealing ring is in contact with at least one of the layers on the first side of the first silicon layer;

each recess of the plurality of recesses results in a chamber;

each sealing ring encloses at least one pump-out port of the plurality of pump-out ports; and the first and second silicon wafers are effectively a bonded together set of wafers.

20. The method of claim 19, further comprising:

placing the set of wafers in an environment of a vacuum wherein a vacuum occurs in each chamber via a pump-out port; and depositing a layer of material on the second side of the first silicon wafer and the plurality of pump-out out ports on the second side of the first silicon wafer, wherein each chamber is sealed from the environment.

21. The method of claim 20, further comprising baking out the set of wafers prior to depositing the layer of material on the second side of the first wafer and the plurality of pump-out ports on the second side of the first silicon wafer.

22. The method of claim 21, wherein the set of wafers is cut into a plurality of chips wherein each chip has one or more sealed chambers.

23. The method of claim 22, wherein the one or more sealed chambers contains one or more devices.

24. The method of claim 19, further comprising:

placing the set of wafers in an environment of a gas wherein the gas enters each chamber via a pump-out port; and depositing a layer of material on the second side of the first silicon wafer and the plurality of pump-out ports on the second side of the first silicon wafer, wherein each chamber is sealed from an ambient environment.

* * * * *